Figure 1:
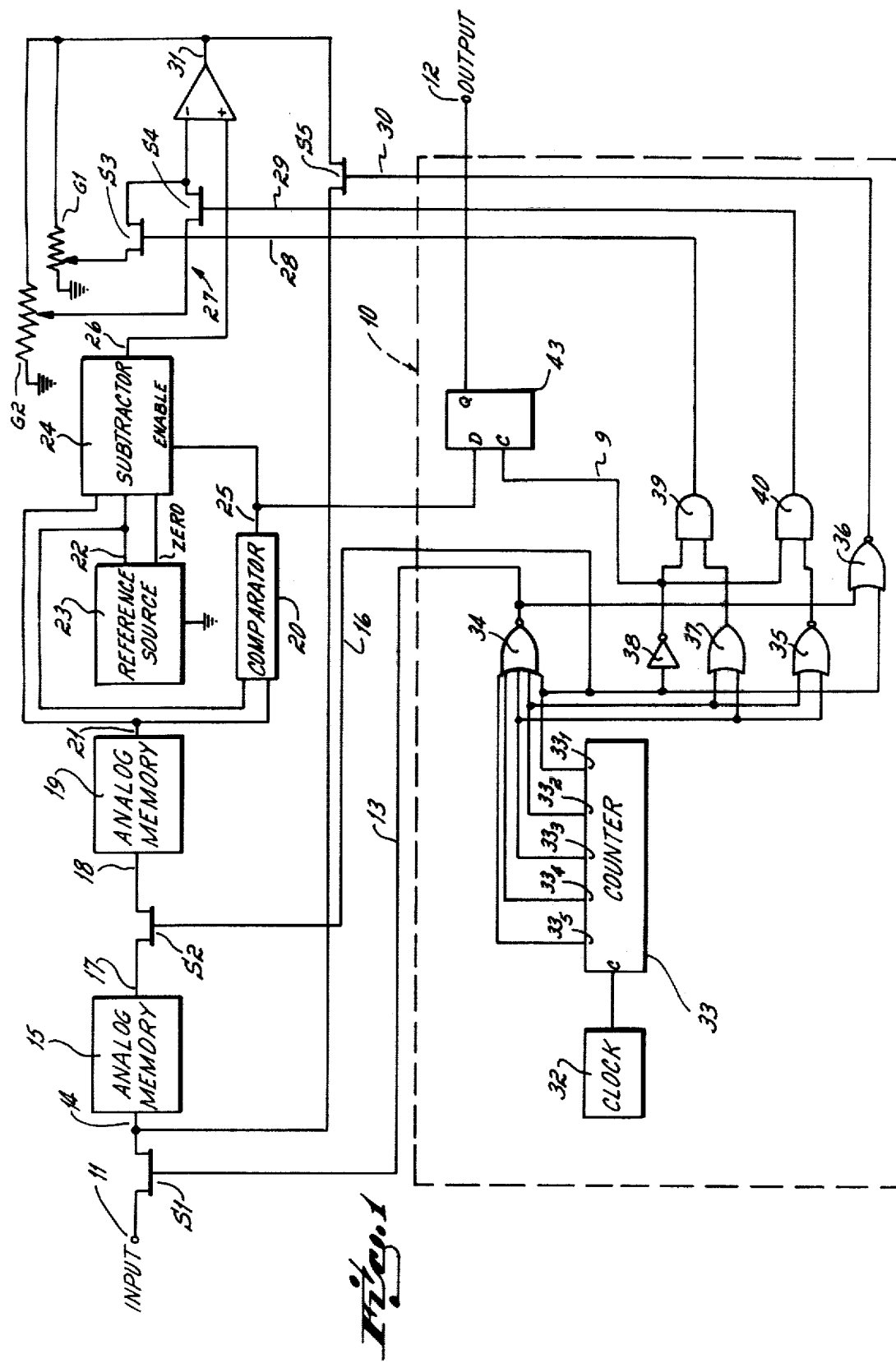
Figure 4:
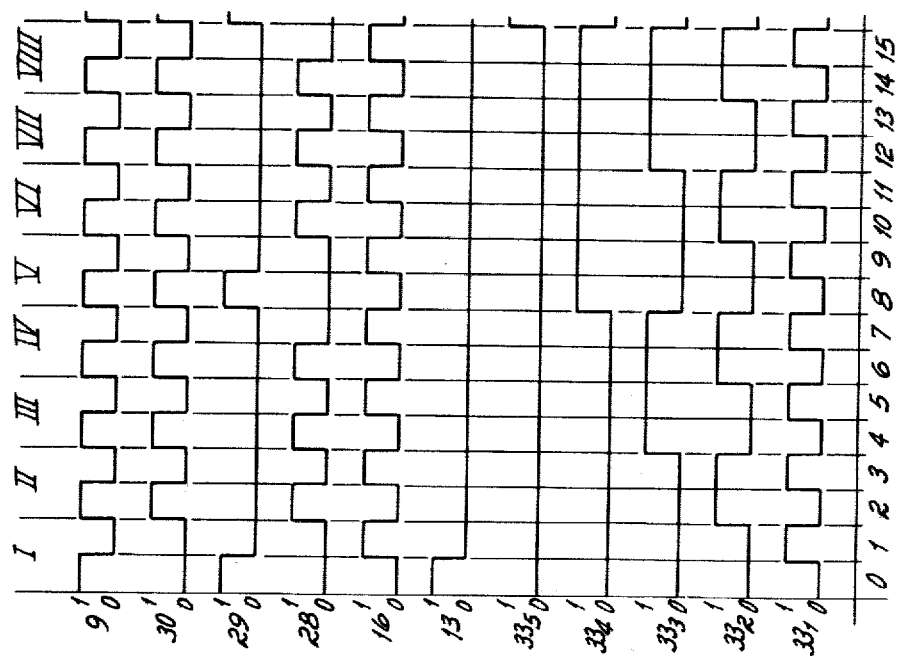

United States Patent [19]
Tytus

[11] 4,315,253
[45] Feb. 9, 1982

[54] ERROR CORRECTION IN RECIRCULATING REMAINDER ANALOG-TO-DIGITAL CONVERTERS

[76] Inventor: Hulbert T. Tytus, 6714 Maple St., Cincinnati, Ohio 45227

[21] Appl. No.: 84,767

[22] Filed: Oct. 15, 1979

Related U.S. Application Data

[62] Division of Ser. No. 10,173, Feb. 7, 1979, abandoned.

[51] Int. Cl.³ .............................................. H03K 13/09
[52] U.S. Cl. .............................. 340/347 CC; 328/151; 340/347 AD; 340/347 M; 340/347 SH
[58] Field of Search .... 340/347 M, 347 AD, 347 SH, 340/347 CC; 328/151

[56] References Cited

U.S. PATENT DOCUMENTS

| | | | |
|---|---|---|---|
| 3,588,881 | 6/1971 | Gordon | 340/347 M X |
| 3,816,803 | 6/1974 | Gordon | 324/111 X |
| 3,940,759 | 2/1976 | Zitelli et al. | 340/347 AD X |
| 4,119,960 | 10/1978 | Hill | 328/151 X |

Primary Examiner—Thomas J. Sloyan
Attorney, Agent, or Firm—Wood, Herron & Evans

[57] ABSTRACT

A recirculating remainder analog-to-digital conversion method and apparatus are disclosed for converting an analog signal into a digitally encoded signal representing the analog signal as two or more digits in a selected number base. Conversion is based on employing two gain factors, one dependent on the digital code used for encoding digits, such as a binary code, and the other dependent on the selected number base for the digits, such as decimal, and by selectively amplifying by the gain factors in a predetermined sequence for producing the signals that are recirculated during conversion of the analog signal into the digitally encoded signal. A method and apparatus are also disclosed for nulling errors in recirculating remainder converters introduced by operation of the converter circuitry by transferring signals through the circuitry once at one polarity and again at the opposite polarity during conversion of the analog signal into the digitally encoded signal.

21 Claims, 4 Drawing Figures

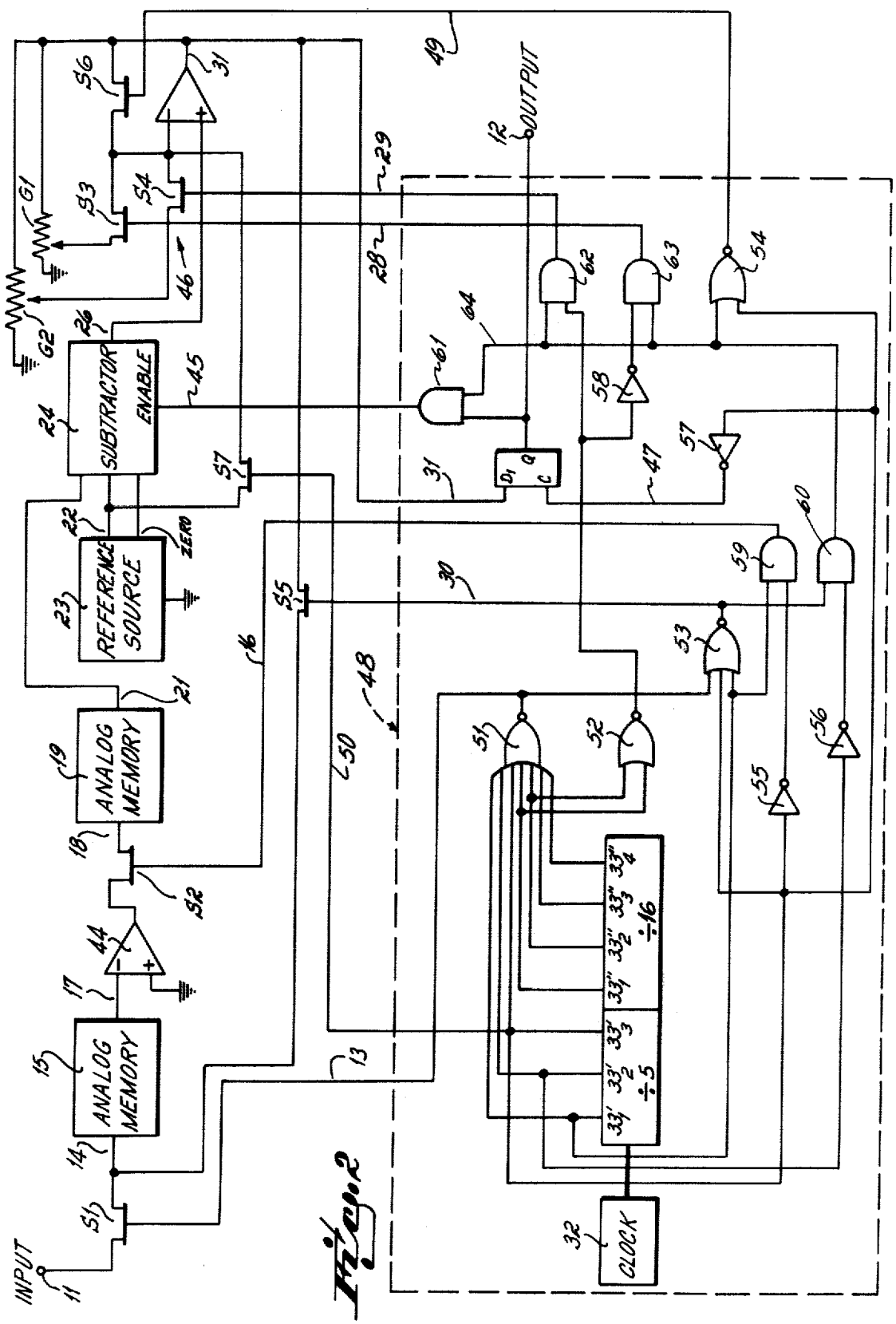

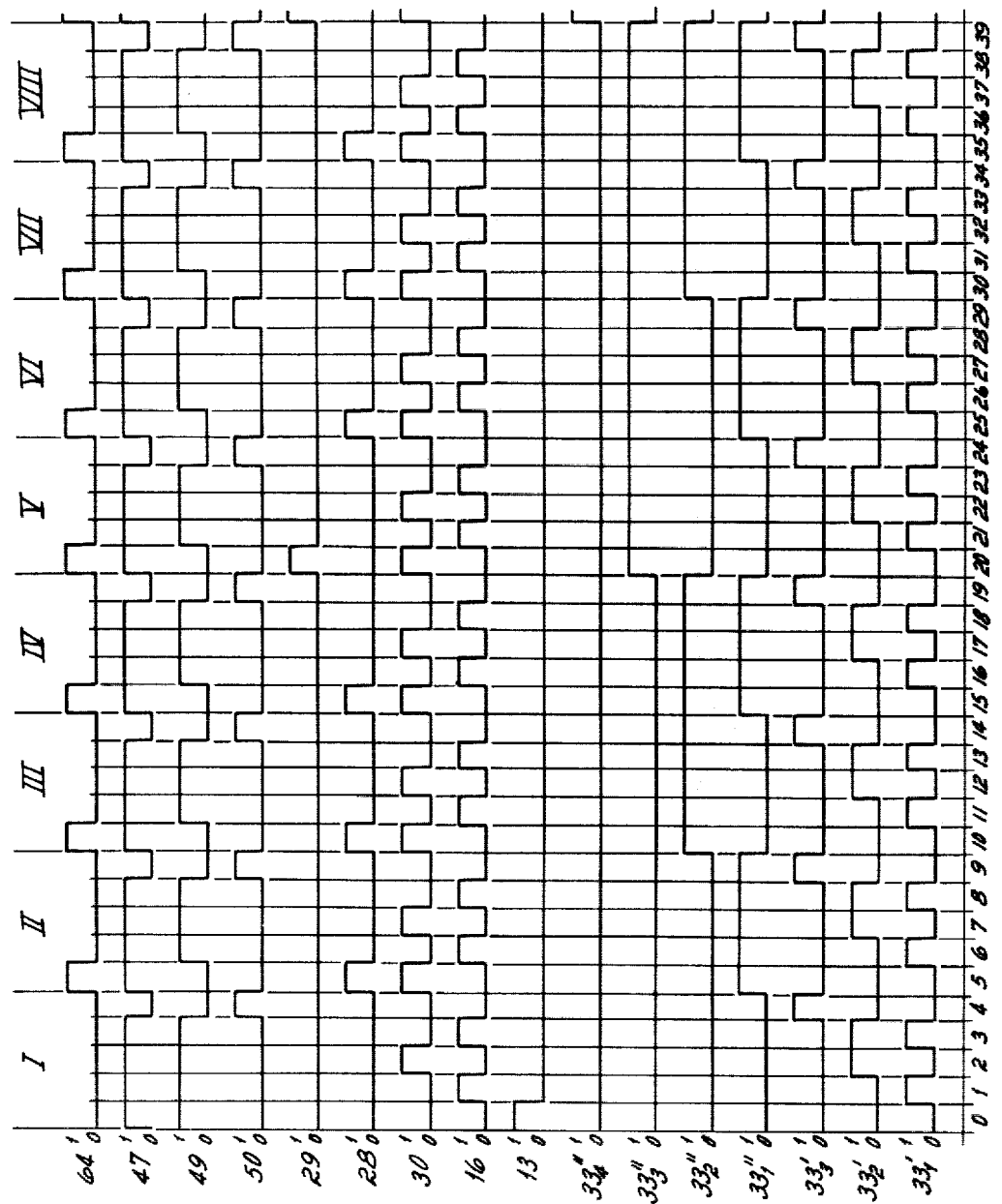

ERROR CORRECTION IN RECIRCULATING REMAINDER ANALOG-TO-DIGITAL CONVERTERS

This is a division of application Ser. No. 10,173, filed Feb. 7, 1979, now abandoned.

This invention relates to the field of analog-to-digital conversion. More particularly, the invention relates to a method and apparatus for directly converting an analog signal into a digitally encoded signal representing the analog signal as two or more digits in a selected number base. The invention also relates to a method and apparatus for improving the accuracy of analog-to-digital converters and, more particularly, to a method and apparatus for automatically nulling errors introduced by operation of the converter circuitry.

There are various known types of analog-to-digital conversion techniques for converting an analog signal, such as a voltage or current, into a digital signal whereby the analog signal is quantitated, that is, represented numerically. The digital signal may in turn drive a display or may be processed by a digital computer, for example.

One method for analog-to-digital conversion disclosed in the prior art is generally referred to as "recirculating successive approximation," or "recirculating remainder." Advantageously, the recirculating remainder method leads to a reduction in the number of circuit components required to perform conversion as compared to the number of circuit components required to perform many other methods of conversion.

Analog-to-digital conversion employing a recirculating remainder method is disclosed, for example, in U.S. Pat. Nos. 2,969,535, 3,164,826, 3,259,896 and 3,703,002. Generally, a recirculating remainder converter compares an analog signal with a reference signal, and the result is processed by digital circuitry as the value of the most significant code bit of the digital signal. If the analog signal equals or exceeds the reference signal, then the reference signal is subtracted, but, if the reference signal is not exceeded, zero is subtracted. The remainder is then multiplied by a remainder gain factor, most typically 2, to provide a signal that is recirculated and stored in an analog memory. Then, the stored signal is circulated through the above sequence to determine the second most significant code bit. The procedure is repeated until the desired number of code bits has been determined.

As shown in the majority of the above-mentioned patents, prior art recirculating remainder converters typically produce a straight binary, or base two, digital signal. It is often desirable, however, to have the digital signal in a number base other than straight binary for driving various utilization devices. Additional digital means for translating the straight binary signal into a digital signal in another number base, such as decimal, may be provided, but such code translating means adds complexity to the converter circuitry as well as expense.

The prior art recirculating remainder converter disclosed in U.S. Pat. No. 3,703,002 in the illustrated embodiment does produce a binary encoded signal representing two or more digits in another number base, that is, decimal. However, the circuitry disclosed in this patent is subject to the serious disadvantage that it is quite complex and therefore too expensive for many applications.

Another disadvantage of the circuitry disclosed in U.S. Pat. No. 3,703,002 and other prior art recirculating remainder converters is that the cost is further increased because they must be constructed with expensive, high grade circuit components and must be carefully calibrated by manual adjustment to null errors due to various factors, such as amplifier offsets and switching transients. Otherwise, the digital signal produced by conversion will be inaccurate.

It is an objective of this invention to provide a recirculating remainder analog signal converter for producing a digitally encoded signal representing the analog signal as two or more digits in a selected number base, for example, decimal, that is, base ten. One exemplary application of the present converter might be to read a voltage in conjunction with a digital voltmeter. The input voltage being measured constitutes the analog signal. The converter changes this signal into a digitally encoded signal representing the voltage in binary coded decimal notation. Thus, the converter output might be 0011, 0100, 1001, corresponding to 3.49 volts. The binary coded decimal output can be connected to a suitable driving circuit adapted to operate a digital readout to display the number 3.49 in decimal form.

It is another objective of this invention to provide a recirculating remainder converter having automatic nulling of most errors, such as errors due to amplifier offsets and switching transients.

It is a further objective of this invention to provide an accurate yet economical recirculating remainder converter whose circuitry is not complex and may be constructed with inexpensive average grade circuit components.

SUMMARY OF THE INVENTION

This invention provides a recirculating remainder analog-to-digital conversion method and apparatus whereby an analog signal is converted into a digitally encoded signal representing the analog signal as two or more digits in a selected number base. In accordance with the invention, the digitally encoded signal is produced by employing two gain factors, one dependent on the digital code used for encoding digits and the other dependent on the selected number base for the digits, and by selectively amplifying by the gain factors in a predetermined sequence for producing the signals that are recirculated during conversion of the analog signal into the digitally encoded signal.

Determination of the conversion sequence is provided by a control logic and processor means. Initially, a first connecting means is closed so that a first analog memory can sample the analog signal to be converted which is fed from an external source. Subsequently, the first connecting means is opened, and a second connecting means is closed so that a second analog memory samples the analog signal stored in the first analog memory. Next, the second connecting means is opened, and a comparator connected to the second analog memory determines if the stored analog signal equals or exceeds a reference signal.

If the reference signal is equaled or exceeded, the most significant code bit for the highest order digit is encoded accordingly, and a subtractor connected to the second analog memory subtracts the reference signal from the stored analog signal to produce a remainder signal. If the stored analog signal is less than the reference signal, the most signficiant code bit of the highest order digit is encoded accordingly, and the subtractor subtracts zero so that the remainder signal equals the stored analog signal.

In accordance with the invention, gain factor circuitry is included for amplifying the remainder signal by one of two gain factors according to a sequence based on the code bit last determined by the comparator. After determination of the most significant code bit, a third connecting means is closed so that the gain factor circuitry amplified by a first gain factor dependent on the digital code used for encoding. Preferably, the digital code used is a binary code.

The amplified remainder signal comprises the signal to be recirculated. A fifth connecting means is closed, and the first analog memory samples the signal to be recirculated.

Subsequently, the fifth connecting means is opened, and the second connecting means is again closed so that the second analog memory samples the signal to be recirculated stored in the first analog memory. Then, the second connecting means is opened and the comparator compares the stored signal with the reference signal to determine the next most significant code bit. Depending on the comparison, the subtractor subtracts the reference signal or zero to produce a new remainder signal. Thereafter, the third connecting means is again closed, and the gain factor circuitry amplifies the new remainder signal by the first gain factor. Finally, the fifth connecting means is closed again so that the first analog memory samples the new signal to be recirculated, and another circulation is initiated.

The above sequence is repeated until a predetermined number of code bits is determined for the highest order digit. In accordance with the invention, after the least significant code bit of the highest order digit is determined, a fourth connecting means is closed so that the gain factor circuitry amplifies the remainder signal by a second gain factor dependent on the selected number base. The number base may be decimal, for example.

The amplified remainder signal is then recirculated to initiate derivation of the next highest order digit according to the procedure outlined above employing the first gain factor. After the least significant code bit is determined for the next highest order digit, the second gain factor is employed, and the amplified remainder signal is recirculated to start derivation of the next highest order digit, and so on, until all digits are derived. The result is preferably binary coded digits in the selected number base.

A method and apparatus are also provided by this invention for nulling errors in recirculating remainder converters introduced by operation of the converter circuitry. In accordance with the invention, the signal to be converted or recirculated is transferred through the converter circuitry at one polarity and again at the opposite polarity during conversion to null errors, such as errors due to amplifier offsets and switching transients. The method and apparatus provided by the invention for nulling errors can be applied to the dual gain recirculating remainder converter of this invention as well as to conventional recirculating remainder converters to improve accuracy.

Nulling errors in the dual gain recirculating remainder converter of this invention is provided by including an inverter between the first analog memory and the second connecting means. A sixth connecting means is also included so that the gain factor circuitry provides a unity gain factor when the sixth connecting means is closed.

The control logic and processor means is modified so that the following takes place before a code bit is determined. Firstly, the fifth and sixth connecting means are closed so that the inverted signal stored in the second analog memory is transferred through the converter circuitry at unity gain to the first analog memory. Second, the fifth and sixth connecting means are opened, and the second connecting means is closed so that the second analog memory samples the inverse of the signal stored in the first analog memory.

Preferably, in order to facilitate nulling errors, a seventh connecting means is included so that the gain factor circuitry is configured as a comparator when the seventh connecting means is closed. In this case, the control logic and processor is modified so that the seventh connecting means is closed and a comparison is performed to determine a code bit before the signal to be recirculated is produced by the combined operation of the subtractor and gain factor circuitry.

This invention, therefore, provides a dual gain recirculating remainder converter for directly converting an analog signal into a digitally encoded signal representing the analog signal as two or more digits in any desired number base by selectively employing two gain factors. The converter of the present invention is extremely flexible in the sense that the format of the digitally encoded signal which is produced can be changed simply by changing one of the gain factors. Since any desired number base can be selected by simply setting gain factors, the present converter has the advantage of being easily adaptable for connection to any of various utilization devices, for example, either binary coded decimal devices or straight binary devices. Advantageously, a serious output can be provided by the present converter without requiring registers for the purpose of storing code bits while conversion is being completed.

The present invention also provides automatic error nulling in dual gain as well as other types of recirculating remainder converters by nulling amplifier offsets and switching transients. Advantageously, the present converter avoids the use of high grade circuit components and the tedious and often elaborate manual adjustments required by many other converters for nulling errors.

The converter of the present invention includes a minimum number of circuit components, in fact one-half the number of circuit components found in some other converters. Also, the circuit components can be a lower grade than that found in most converters. Consequently, the converter of the present invention is relatively inexpensive, but not at a sacrifice of accuracy. On the contrary, the accuracy is an order of magnitude greater than that attainable with many other converters. As a result, the present converter can actually provide improved accuracy at reduced cost.

The present invention will be better understood, and the above and other advantages will become clear, after a consideration of the following description in connection with the drawing in which:

FIG. 1 is a schematic block diagram of an embodiment for a dual gain recirculating remainder converter in accordance with the present invention, and FIG. 1A is a timing diagram for FIG. 1; and FIG. 2 is a schematic block diagram of an embodiment for a dual gain recirculating remainder converter having error nulling, and FIG. 2A is a timing diagram for FIG. 2.

The dual gain recirculating remainder conversion method and apparatus of this invention preferably uses a digital code, known as a binary code, having two discrete states, defined as a "1" state and a "0" state, as code bits for encoding digits. The digits in turn form a number in any desired number base. The selected number base may be for example, base ten, that is, decimal. However, any other number base, for example, base twelve, that is, duodecimal, can be selected just as easily.

Since a binary code is preferably used for encoding digits, adjacent code bits representing any given digit differ by a factor of two. Consequently, in accordance with the invention, one gain factor, $G_1$, is preferably two for differentiating between adjacent code bits of a given digit.

Preferably, at least two digits are derived during an analog-to-digital conversion in order to obtain accuracy. In accordance with the invention, another gain factor is selected so that at least two digits in the selected number base can be derived. This gain factor is dependent on the selected number base. Since a binary code is used for encoding digits, the second gain factor, $G_2$, for deriving digits in the selected number base is given by the expression $$G_2 = \frac{\text{Selected Number Base}}{2^x},$$

where $x$ is an integer and $2^{x+1} > \text{Selected Number Base} \geq 2^x$.

consequently, the digits encoded will be in a selected number base equal to $G_1^{(N-1)}G_2$, where N is a predetermined number of code bits determined for each digit encoded.

Now, let

L = preselected number of digits encoded
N = predetermined number of code bits determined for each digit encoded
$V_I$ = analog signal to be converted
$V_R$ = reference signal given by the expression
$V_R = 2^y \cdot \text{Selected Number Base}^z$, where $$2^{y+1} > \frac{|V_{I\,Limit}|}{\text{Selected Number Base}^z} \geq 2^y,$$

Selected Number $\text{Base}^{z+1} \geq |V_{I\,Limit}| > $ Selected Number $\text{Base}^z$, $V_{I\,Limit}$ is the amplitude of the maximum analog signal to be converted, and y and z are integers
$V_c$ = circulated analog signal
$B_i$ = binary value of code bit determined
$G_1 = 2$ for encoding digits in a binary code $$G_2 = \frac{\text{Selected Number Base}}{2^x},$$

where x is an integer and $2^{x+1} > $ Selected Number $\text{Base} \geq 2^x$.

Conversion is performed in accordance with the following procedure, where i is an integer representing an operator in the conversion series:

A: $V_c = V_I$
B: $i = i + 1$
C: If $|V_c| \geq |V_R|$, then $V_c = V_c - V_R$ and $B_i = $ "1"; otherwise, $V_c = V_c - 0$ and $B_i = $ "0"
D: If $i \neq Nj$ where j is an integer, then $V_c = G_1 V_c$; otherwise, $V_c = G_2 V_c$ E: If $i \neq LN$, then repeat B through E; otherwise, end.

A circuit for performing the procedure outlined above will now be described in connection with FIG. 1. Referring to FIG. 1, a control logic and processor means 10 determines the sequence for conversion of an analog signal into a digitally encoded signal representing the analog signal as two or more digits in a selected number base. The analog signal is input at a terminal 11, and the digitally encoded signal produced by conversion is output at a terminal 12.

Initially, control logic and processor 10 provides a control pulse on line 13, enabling a first connecting means, or switch, S1. When switch S1 is enabled, input terminal 11 is connected to a memory input 14 of a first analog memory 15. Consequently, memory 15 samples and stores the analog signal which appears at input terminal 11.

At the start of conversion, the control pulse on line 13 terminates, disabling switch S1. When switch S1 is disabled, input terminal 11 is isolated from the remainder of the circuit in FIG. 1.

In a first interval of conversion, control logic and processor 10 provides a control pulse on line 16, enabling a second connecting means, or switch, S2. When switch S2 is enabled, a memory output 17 of memory 15 is connected to a memory input 18 of a second analog memory 19. Consequently, memory 19 samples and stores the signal stored in memory 15.

In a second interval of conversion, the control pulse on line 16 terminates, disabling switch S2. When switch S2 is disabled, memory 15 is disconnected from memory 19.

A comparator 20 is connected to a memory output 21 of memory 19 and receives a reference signal 22 supplied by a reference source 23. An output 25 of comparator 20 is connected to control logic and processor 10.

Furthermore, a subtractor 24 is connected to memory output 21 of memory 19 and receives reference signal 22 and a "zero" reference signal supplied by reference source 23. Subtractor 24 is also connected to output 25 of comparator 20.

During the second interval of conversion, comparator 20 determines whether or not the signal stored in memory 19 is less than reference signal 22. If the signal stored in memory 19 is not less than reference signal 22, a first comparator signal appears at output 25 of comparator 20 causing subtractor 24 to subtract reference signal 22 from the signal stored in memory 19 to produce a remainder signal at a difference output 26. If reference signal 22 is greater, a second comparator signal appears at output 25 of comparator 20 causing subtractor 24 to subtract the "zero" reference signal from the signal stored in memory 19 to produce a remainder signal at difference output 26.

During the second interval of conversion, control logic and processor 10 stores and/or transmits the signal at output 25 of comparator 20. This provides a code bit for a digit at output terminal 12.

Difference output 26 of subtractor 24 is connected to gain factor circuitry 27. Gain factor circuitry 27 selectively provides a first gain factor or a second gain factor for amplifying the remainder signal at difference output 26 of subtractor 24.

In the second interval of conversion, control logic and processor 10 provides a control pulse on line 28 or on line 29, respectively enabling a third connecting means, or switch, S3 or a fourth connecting means, or switch, S4 so as to alternatively select either the first gain factor or the second gain factor. Switch S3 is enabled unless the code bit just determined by comparator 20 is the least significant code bit of a digit. Otherwise, switch S4 is enabled. Consequently, gain factor circuitry 27 amplifies the remainder signal at difference output 26 of subtractor 24 by the selected gain factor to produce a signal to be recirculated.

Also, during the second interval of conversion, control logic and processor 10 provides a control pulse on line 30, enabling a fifth connecting means, or switch, S5. When switch S5 is enabled, an output 31 of gain factor circuitry 27 is connected to memory input 14 of memory 15. Consequently, memory 15 samples and stores the amplified remainder signal appearing at output 31 of gain factor circuitry 27.

At the start of the next interval of conversion, the control pulse on either line 28 or line 29 as well as the control pulse on line 30 terminate, disabling switch S3, or switch S4, and switch S5. In order to determine the remaining code bits of a digit, the two above-described intervals of conversion are repeated, and switch S3 is enabled in the second interval of conversion so that gain factor circuitry 27 amplifies the remainder signal at difference output 26 of subtractor 24 by the first gain factor. This continues until after all the code bits of a digit are determined.

After the least significant code bit of a digit is determined, however, switch S4 is enabled in the second interval of conversion so that gain factor circuitry 27 amplifies the remainder signal at difference output 26 of subtractor 24 by the second gain factor. Thereafter, the two above-described intervals of conversion are repeated to determine the code bits of the next digit, and, again, the first gain factor is selected in the second interval of conversion, and so forth.

As shown, field effect transistors preferably comprise the connecting means. Other connecting means, however, may be utilized. Also, as shown, the circuit includes first and second analog memories 15 and 19. However, the circuit can be modified by eliminating memory 19 as well as switch S2 and including appropriate delay circuitry between switch S5 and memory 15. A circuit with two analog memories is, however, preferred.

Control logic and processor 10 may comprise any means, either hardware or software, for controlling switches S1-S5 in the sequence described above by providing control pulses on lines 13, 16, 28, 29 and 30. In FIG. 1, for example, control logic and processor 10 is shown to include a clock 32 incrementing a counter 33. As shown, counter 33 has five binary outputs $33_1$-$33_5$ for activating logic circuitry, including NOR gates 34-36, an OR gate 37, an inverter 38 and AND gates 39-40, for producing control pulses on lines 13, 16, 28, 29 and 30 to illustrate the case where the number of digits encoded, L, equals four and the number of code bits encoded for each digit, N, equals four. The derivation of four digits each encoded by four code bits is exemplary only, and a different number of digits and/or a different number of code bits per digit can be determined by suitable modifications of control logic and processor 10.

In FIG. 1, the output 25 from comparator 20 is shown directly connected to the D input of a D flip-flop 43, but a buffer amplifier may be interposed. The signals from comparator 20 represent code bits and are preferably clocked by control pulses on line 9 serially to output terminal 12. However, registers might be provided in control logic and processor 10 so that a parallel output is provided, if desired.

FIG. 1A shows a timing diagram for the circuit in FIG. 1 during derivation of the first two of four digits. The periods in FIG. 1A labeled I-IV indicate the spans of time during which the four code bits for the first digit are derived, while the periods labeled V-VIII indicate the spans of time during which the four code bits for the second digit are derived. At the end of each code bit period I-VIII, a code bit appears at output terminal 12 in FIG. 1.

It will be readily apparent to those of skill in the art that the circuitry in FIG. 1 can be modified for controlling the switches S1-S5 according to the sequence described above to produce a digitally encoded signal having any desired number of digits by selecting a counter having the necessary number of binary outputs for activating the logic circuitry. Also any number of code bits required for encoding a digit can be determined by changing the sequence so that, during the derivation of each digit, switch S4 is closed earlier for reducing the number of code bits or later for increasing the number of code bits.

Table 1 presents an example employing a recirculating remainder method with the added feature provided by the present invention of selectively employing two remainder gain factors at appropriate times in a sequence for converting an analog signal, in this case 3.56 volts, into a digitally encoded signal, in this case binary coded decimal (BCD). Other formats for the digitally encoded signal are, of course, equally possible, but BCD has been chosen due to common usage.

TABLE 1

| 1A | 1B | 1C | 1D | 1E |
|---|---|---|---|---|
| (3.56 | − 0) | × 2 | = 7.12 | 0 |
| (7.12 | − 0) | × 2 | = 14.24 | 0 |
| (14.24 | − 8) | × 2 | = 12.48 | 1 |
| (12.48 | − 8) | × 1.25 | = 5.6 | 1 |
| (5.6 | − 0) | × 2 | = 11.2 | 0 |
| (11.2 | − 8) | × 2 | = 6.4 | 1 |
| (6.4 | − 0) | × 2 | = 12.8 | 0 |
| (12.8 | − 8) | × 1.25 | = 6 | 1 |
| (6 | − 0) | × 2 | = 12 | 0 |
| (12 | − 8) | × 2 | = 8 | 1 |
| (8 | − 8) | × 2 | = 0 | 1 |
| (0 | − 0) | × 1.25 | | 0 |

With reference to the procedure outlined earlier, L equals three, N equals four, $V_I$ is 3.56 volts, $V_{I\ Limit}$ is 9.99 volts, and the selected number base is decimal. Consequently, $V_R$ equals eight volts. Since $G_1$ equals two and the selected number base is decimal, $G_2$ equals 1.25.

In Table 1, column 1A shows, in the first line, the analog signal to be converted, 3.56 volts, which is initially connected through switch S1 in FIG. 1. Column 1B represents the voltage from reference source 23 in FIG. 1 which subtractor 24 subtracts from the voltage in column 1A depending on whether or not the voltage in column 1A exceeds the reference voltage 22, which in the example shown is eight volts. Column 1C represents the gain of gain factor circuitry 27 in FIG. 1 selected by switch S3 or switch S4 for amplifying the remainder voltage produced by subtraction of an entry in column 1B from the corresponding entry in column 1A, and column 1D shows the amplified remainder voltage which constitutes the voltage to be recirculated. The remaining lines in column 1A represent the voltage to be recirculated which is connected through switch S5 in FIG. 1 to memory 15. Column 1E represents the code bit at output 25 of comparator 20 in FIG. 1 and can be observed to be an indication of whether or not the voltage present in column 1A exceeds the reference voltage 22.

With reference to FIG. 1 and Table 1, 3.56 volts is initially stored in memory 15 when switch S1 is enabled. Switch S1 is then disabled. Next, switch S2 is enabled so that 3.56 volts is stored in memory 19. Switch S2 is then disabled, and switches S3 and S5 are enabled. Comparator 20 determines that the reference voltage of eight volts is not less than 3.56 volts, and, accordingly, a "0" code bit is determined. Consequently, subtractor 24 subtracts zero volts from 3.56 volts yielding 3.56 volts which gain factor circuitry 27 amplifies by two since switch S3 is enabled. The result of amplification is 7.12 volts which comprises the voltage to be recirculated. Since switch S5 is enabled, 7.12 volts is stored in memory 15. Then, switches S3 and S5 are disabled, and switch S2 is again enabled so that 7.12 volts is circulated through the circuit. The sequence is repeated until four code bits are determined, whereupon gain factor circuitry 27 amplifies by the second gain factor of 1.25 before proceeding to derive the next digit, and so forth. The resultant digitally encoded signal in column 1E, "0011", "0101", "0110", is the BCD representation of 3.56 volts which appears serially, for example, at output terminal 12 in FIG. 1.

As alluded to earlier, recirculating remainder converters have been known for some time. In many cases, however, the accuracy of known recirculating remainder converters suffers due to errors attributable to the operating characteristics of the circuit components used in manufacture of the converter circuitry. One typical example is switching transients which cause errors in the signals stored by analog memory circuitry and another example is amplifier offsets.

There are known methods which normally require manual adjustment of the converter circuitry for nulling various errors. This invention provides a method and apparatus for nulling errors automatically whereby the need for manual adjustment of the converter circuitry is eliminated.

In recirculating remainder converters, a large portion of the error is attributable to the operating characteristics of analog memory circuitry in the form of a difference between the ideal and the actual output voltage for a given input voltage. Furthermore, a large portion of this error over the short term is constant regardless of the amplitude of the input voltage to be stored. In other words, the error voltage resulting when storing zero volts will be the same as the error voltage resulting when storing 3 volts or 6 volts.

In accordance with the invention, a given voltage to be processed for code bit determination in a recirculating remainder converter is rendered free of such constant error by transferring the voltage through the analog memory circuitry once and then transferring the voltage through again at the opposite polarity. The result is a voltage having a magnitude which is equal to the magnitude of the input voltage but a polarity opposite to that of the input voltage. Furthermore, with proper sequencing of operations, some other errors which are not truly constant in relation to the amplitude of the input voltage are nulled if the magnitude of the voltage processed through the analog memory circuitry is held approximately equal for each transfer during the determination of an individual code bit.

In accordance with this invention, a voltage to be processed is transferred through the analog memory circuitry once and then again at opposite polarity for nulling error, even though the polarity of the voltage to be processed is reversed. The voltage to be processed might be transferred through the analog memory circuitry twice with the polarity of only the error voltage being inverted on the second transfer through for nulling error without reversing the polarity of the voltage to be processed. However, the latter approach is impractical since the error voltage must be separated and inverted, whereas the approach of this invention is practical since the converter circuitry can easily be provided with a built-in capability for handling the reversed polarity of the voltage to be processed.

Also, the operating characteristics of the various amplifiers in the converter circuitry can introduce constant errors in the form of offsets. In accordance with the invention, offsets are nulled by transferring the voltage to be processed through each amplifier once and then again at the opposite polarity so that the number of positive amplifier output voltages equals the number of negative amplifier output voltages.

Furthermore, if the amplifier which performs comparison is included in recirculating the voltage through the analog memories at opposite polarities and, subsequently, the memory output voltage is compared with the reference voltage, the memory output voltage contains the inverted offset of the comparator amplifier. Under these circumstances, the comparator amplifier can perform a comparison free from apparent offset error. A similar approach also applies for nulling the offset error of the gain factor circuitry amplifier.

The error nulling method and apparatus of the invention will be described in connection with a dual gain recirculating remainder converter. Error nulling in accordance with the invention, however, also applies to conventional recirculating remainder converters.

The circuit shown in FIG. 2 is essentially the circuit in FIG. 1 with modifications for the purpose of providing error nulling. Briefly, this requires modification of the circuit in FIG. 1 to include a unity gain inverter and modification of the gain factor circuitry to alternatively provide an additional gain factor of unity. Preferably, the gain factor circuitry is further modified to selectively act as a comparator to eliminate the separate comparator circuitry shown in FIG. 1. This facilitates error nulling. Modification of the control logic and processor in FIG. 1 is also required as will be described later.

With reference to FIG. 2, initially, a control logic and processor means 48 provides a control pulse on line 13, enabling switch S1. When switch S1 is enabled, input terminal 11 is connected to memory input 14 of memory 15. Consequently, memory 15 samples and stores the analog signal which appears at input terminal 11.

At the start of conversion, the control pulse on line 13 terminates, disabling switch S1. When switch S1 is disabled, input terminal 11 is isolated from the remainder of the circuit in FIG. 2.

In a first interval of conversion, control logic and processor 48 provides a control pulse on line 16, enabling switch S2. When switch S2 is enabled, memory output 17 of memory 15 is connected to memory input 18 of memory 19 through a unity gain inverter 44. Consequently, memory 19 samples the inverse of the signal initially appearing at input terminal 11 after transfer through memory 15 and inverter 44.

In a second interval of conversion, the control pulse on line 16 terminates, disabling switch S2. When switch S2 is disabled, memory 15 is disconnected from memory 19.

Subtractor 24 when disabled subtracts the "zero" reference signal from the signal stored in memory 19. During the second interval of conversion, control logic and processor 48 provides a control pulse on line 30, enabling switch S5, and also provides a control pulse on line 49, enabling a sixth connecting means, or switch, S6. When switches S5 and S6 are enabled, memory 19 is connected through disabled subtractor 24, through gain factor circuitry 46 providing a unity gain factor selected by enabling switch S6 and through switch S5 to memory input 14 of memory 15. Consequently, memory 15 samples the inverted signal earlier stored in memory 19 after the inverted signal is transferred through memory 19 and the amplifier in gain factor circuitry 46. As a result, the inverted signal contains the inverse of the offset of the gain factor circuitry amplifier, in addition to other errors introduced by transfer through memories 15 and 19 and inverter 44.

In a third interval of conversion, the control pulses on lines 30 and 49 terminate, disabling switches S5 and S6. When switches S5 and S6 are disabled, memory 19 is disconnected from memory 15.

During the third interval of conversion, control logic and processor 48 again provides a control pulse on line 16, enabling switch S2. When switch S2 is enabled, memory 15 is again connected to memory 19 through unity gain inverter 44. Consequently, memory 19 samples the inverse of the signal stored in memory 15.

Now, the signal stored in memory 19 represents the initial signal as previously transferred through memory 15 as well as inverter 44 at original polarity and, then, through memory 19, the gain factor circuitry amplifier, memory 15 and inverter 44 at inverse polarity. This nulls the errors introduced by operation of memory 15 and inverter 44. Upon subsequent transfer from memory 19 through the gain factor circuitry amplifier, as will be described shortly, the errors introduced by operation of memory 19 and the gain factor circuitry amplifier are also nulled.

In a fourth interval of conversion, the control pulse on line 16 terminates, disabling switch S2. When switch S2 is disabled, memory 15 is disconnected from memory 19.

During the fourth interval of conversion, control logic and processor 48 provides a control pulse on line 50, enabling a seventh connecting means, or switch, S7. When switch S7 is enabled, gain factor circuitry 46 is configured as a comparator. Switch S7 connects reference signal 22 from reference source 23 to the inverting input of the gain factor circuitry amplifier. Since the signal stored in memory 19 is connected through disabled subtractor 24 to the noninverting input of the gain factor circuitry amplifier, a comparison is performed between the signal stored in memory 19 and reference signal 22, thereby determining a code bit. During the fourth interval of conversion, control logic and processor 48 stores the code bit and preferably transmits the code bit to output terminal 12 as well.

In a fifth interval of conversion, the control pulse on line 50 terminates, disabling switch S7. When switch S7 is disabled, gain factor circuitry 46 is no longer configured as a comparator.

During the fifth interval of conversion, control logic and processor 48 either enables or disables subtractor 24. If the signal stored in memory 19 is not less than reference signal 22, control logic and processor 48 enables subtractor 24 via line 45. This results in subtraction of reference signal 22 from the signal stored in memory 19 to produce a remainder signal at difference output 26 of subtractor 24. If reference signal 22 is greater, subtractor 24 is disabled. This results in subtraction of the "zero" reference signal from the signal stored in memory 19 to produce a remainder signal at difference output 26 of subtractor 24.

In the fifth interval of conversion, control logic and processor 48 also provides a control pulse on line 28 or 29, respectively enabling switch S3 or switch S4 so as to alternatively select either the first gain factor or the second gain factor. As described earlier, switch S3 is enabled unless the code bit just determined is the least significant code bit of a digit. Otherwise, switch S4 is enabled. Consequently, gain factor circuitry 46 amplifies the remainder signal at difference output 26 of subtractor 24 by the selected gain factor to produce the signal to be recirculated.

Furthermore, during the fifth interval of conversion, control logic and processor 48 provides a control pulse on line 30, enabling switch S5. When switch S5 is enabled, memory 15 is connected to output 31 of gain factor circuitry 46. Consequently, memory 15 samples and stores the signal to be recirculated.

In order to determine the remaining code bits of a digit, the five above-described intervals of conversion are repeated, and switch S3 is enabled during the fifth interval of conversion so that gain factor circuitry 46 amplifies the remainder signal at difference output 26 of subtractor 24 by the first gain factor. This completes determination of all the code bits of a digit.

After the least significant code bit of a digit is determined, however, switch S4 is enabled during the fifth interval of conversion so that gain factor circuitry 46 amplifies the remainder signal at difference output 26 of subtractor 24 by the second gain factor. Thereafter, the five above-described intervals of conversion are repeated to determine the code bits of the next digit, and the first gain factor is again employed in the fifth interval of conversion, and so forth.

By transferring the signal to be recirculated, stored in memory 15, through the circuit in FIG. 2 once and then again at the opposite polarity before a code bit is determined, most errors, such as due to amplifier offsets and switching transients, are automatically nulled. As a result, the signal at output 31 of gain factor circuitry 46, which provides the code bit or the signal to be recirculated, will be virtually free of error.

Control logic and processor 48 may comprise any hardware or software means for controlling switches S1–S7 in the sequence described above by providing control pulses on lines 13, 16, 28, 29, 30, 45, 49 and 50. The circuit shown in FIG. 2 for control logic and processor 48 is an example of how the circuit in FIG. 1 may be modified to provide such control pulses. In FIG. 2, for example, control logic and processor 48 is shown to include a clock 32 incrementing a divide-by-five binary counter connected with a divide-by-sixteen binary counter. As shown, the divide-by-five counter has three binary outputs $33_{1-3}'$ and the divide-by-sixteen counter has four binary outputs $33_{1-4}''$. The binary outputs activate logic circuitry, including NOR gates 51–54, inverters 55–58 and AND gates 59–63, for producing control pulses on lines 13, 16, 28, 29, 30, 45, 49 and 50 to illustrate the case where the number of digits encoded, L, equals four and the number of code bits encoded for each digit, N, equals four. However, suitable modification of control logic and processor 48 would permit a different number of digits and/or a different number of code bits per digit to be determined.

FIG. 2A is a timing diagram for the circuit in FIG. 2 during derivation of the first two of four digits. The periods in FIG. 2A labeled I–IV indicate the spans of time during which the four code bits for the first digit are derived, while the periods labeled V–VIII indicate the spans of time during which the four code bits for the second digit are derived. At the end of each code bit period I–VIII, a code bit appears at output terminal 12 in FIG. 2.

The present invention provides a process and circuit to produce a digitally encoded signal directly encoded into a selected number base. Furthermore, the circuit has more flexibility in terms of output ranges than dual-slope analog-to-digital converters.

The accuracy of the digitally encoded signal is independent of errors introduced by operation of individual circuit components. Therefore, average grade circuit components can be used in manufacture. This means in turn that the circuit is economical. The circuit has comparable accuracy to a dual-slope analog-to-digital converter circuit and yet has only a fraction of the complexity and cost.

Although the method and apparatus for nulling errors introduced by operation of circuit components are primarily described in connection with the dual gain recirculating remainder converter of the invention, it is obvious that such method and apparatus could be applied to any type of recirculating remainder converter.

Consequently, the invention is not limited to the specific details as shown but is defined as set forth in the appended claims.

I claim:

1. In a recirculating remainder converter for converting an analog signal into a digitally encoded signal, said converter including two analog memories for sampling and storing analog signals related to a voltage to be converted, means for comparing said stored signals with a reference signal, means responsive to said comparison for providing a code bit, means responsive to said comparison for producing a remainder signal, means for amplifying said remainder signal, means for recirculating said amplified remainder signal to one of said analog memories, the improvement in said converter, comprising:
    error nulling means including inverting means for inverting the polarity of the recirculated signal, the polarity of said signal being inverted an even number of times between successive comparisons.

2. In a recirculating remainder converter for converting an analog signal into a digitally encoded signal, said converter including two analog memories for sampling and storing analog signals related to a voltage to be converted, means for comparing said stored signals with a reference signal, means responsive to said comparison for providing a code bit, means responsive to said comparison for producing a remainder signal, means for amplifying said remainder signal, means for recirculating said amplified remainder signal to one of said analog memories, the improvement in said converter, comprising:
    error nulling means including inverting means for inverting the polarity of the recirculated signal, the polarity of said signal being inverted an even number of times between successive commencements of amplification of said remainder signal.

3. In a recirculating remainder converter for converting an analog signal into a digitally encoded signal, said converter including two analog memories for sampling and storing analog signals related to a voltage to be converted, each said analog memory having an output voltage, means for comparing at least one of said output voltages with a reference signal, means responsive to said comparison for providing a code bit, means responsive to said comparison for producing a remainder signal, means for amplifying said remainder signal, means for recirculating said amplified remainder signal to one of said analog memories, the improvement comprising:
    inverting means for inverting the polarity of the recirculated signal, said recirculating means and means for inverting the polarity of the recirculated signal causing each of said analog memories to sample said recirculated signal a number of times during an interval between the ends of successive comparisons of said output voltage and reference signal, which provides a code bit, such that the number of sampled voltages of each said memory which are to be recirculated by said converter and which are positive with reference to ground equals the number of sampled voltages of each said memory which are to be recirculated by said converter and which are negative with reference to ground.

4. In a recirculating remainder converter for converting an analog signal into a digitally encoded signal, said converter including two analog memories for sampling and storing analog signals related to a voltage to be converted, each said analog memory having an output voltage means for comparing at least one of said output voltages with a reference signal, means responsive to said comparison for providing a code bit, means responsive to said comparison for producing a remainder signal, means for amplifying said remainder signal, means for recirculating said amplified remainder signal to one of said analog memories, the improvement comprising:
    inverting means for inverting the polarity of the recirculated signal, said recirculating means and means for inverting the polarity of the recirculated signal causing each of said analog memories to sample said recirculated signal a number of times during an interval between the successive starts of amplification of said remainder signal, such that the number of sampled voltages for each said memory which are to be recirculated by said converter and which are positive with reference to ground equals the number of sampled voltages of each said memory which are to be recirculated by said converter and which are negative with reference to ground.

5. In a recirculating remainder converter for converting an analog signal into a digitally encoded signal, said converter including analog memory means for storing an analog signal, means for comparing said stored signal with a reference signal, means responsive to said comparison for providing a code bit, means responsive to said comparison for producing a remainder signal by subtracting said reference signal from said stored signal if said stored signal is not less than said reference signal and for subtracting zero from said stored signal if said stored signal is less than said reference signal, means for amplifying said remainder signal, means for recirculating said amplified remainder signal to said memory means and means for controlling said memory, comparing, code bit providing, remainder signal producing, amplifying and recirculating means in sequence, the improvement in said converter, comprising:
- error nulling means for transferring said stored signal at inverse polarity through at least said amplifying means at unity gain back to said memory means; and
- circuitry included in said controlling means for activating said error nulling means during determination of said code bit;
- whereby said stored signal is transferred at one polarity and then again at opposite polarity through at least said amplifying means during determination of said code bit for nulling errors introduced by operation of said converter circuit.

6. The converter apparatus of claim 5 wherein said error nulling means transfers said stored signal at inverse polarity through said comparing and amplifying means at unity gain back to said memory means.

7. In a recirculating remainder converter for converting an analog signal into a digitally encoded signal, said converter including analog memory means for storing an analog signal, means for comparing said stored signal with a reference signal, means responsive to said comparison for providing a code bit, means responsive to said comparison for producing a remainder signal by subtracting said reference signal from said stored signal if said stored signal is not less than said reference signal and for subtracting zero from said stored signal if said stored signal is less than said reference signal, means for amplifying said remainder signal, means for recirculating said amplified remainder signal to said memory means and means for controlling said memory, comparing, code bit providing, remainder signal producing, amplifying and recirculating means in sequence, the improvement in said converter, comprising:
- error nulling means for transferring said stored signal at inverse polarity through at least said memory means at unity gain back to said memory means; and
- circuitry included in said controlling means for activating said error nulling means during determination of said code bit;
- whereby said stored signal is transferred at one polarity and then again at opposite polarity through at least said memory means during determination of said code bit for nulling errors introduced by operation of said converter circuit.

8. In an apparatus for converting an analog signal into a digitally encoded signal, said converter including an analog memory means for storing an analog signal fed thereto, connecting means for feeding an analog signal to be converted to said memory means, a comparator for determining code bits by comparing an analog signal stored in said memory means with a reference signal, a subtractor for producing a remainder signal by subtracting said reference signal from said signal stored in said memory means if said signal stored in said memory means is not less than said reference signal and for subtracting zero if said signal stored in said memory means is less than said reference signal, means for amplifying said remainder signal, recirculating means for feeding said amplified remainder signal to said memory means and means for initially controlling said connecting and memory means and next repetitively controlling said memory means, comparator, subtractor, amplifying means and recirculating means in sequence for providing a series of code bits representing a digitally encoded signal, the improvement in said converter, comprising:
- error nulling means for feeding said signal stored in said memory means at inverse polarity through at least said amplifying means back to said memory means; and
- circuitry included in said controlling means for activating said error nulling means in a time period commencing at the end of an interval in which one of said series of code bits is determined and concluding at the end of an interval in which the next of said series of code bits is determined;
- whereby the number of signals output from said amplifying means at one polarity equals the number of signals output from said amplifying means at the other polarity.

9. The converter apparatus of claim 8 wherein said error nulling means transfers said stored signal at inverse polarity through said comparing and amplifying means back to said memory means.

10. In an apparatus for converting an analog signal into a digitally encoded signal, said converter including an analog memory means for storing an analog signal fed thereto, connecting means for feeding an analog signal to be converted to said memory means, a comparator for determining code bits by comparing an analog signal stored in said memory means with a reference signal, a subtractor for producing a remainder signal by subtracting said reference signal from said signal stored in said memory means if said signal stored in said memory means is not less than said reference signal and for subtracting zero if said signal stored in said memory means is less than said reference signal, means for amplifying said remainder signal, recirculating means for feeding said amplified remainder signal to said memory means and means for initially controlling said connecting and memory means and next repetitively controlling said memory means, comparator, subtractor, amplifying means and recirculating means in sequence for providing a series of code bits representing a digitally encoded signal, the improvement in said converter, comprising:
- error nulling means for feeding said signal stored in said memory means at inverse polarity through at least said memory means back to said memory means; and
- circuitry included in said controlling means for activating said error nulling means in a time period commencing at the end of an interval in which one of said series of code bits is determined and concluding at the end of an interval in which the next of said series of code bits is determined;
- whereby the number of signals output from said memory means at one polarity equals the number of signals output from said memory means at the other polarity.

11. A method for nulling errors during conversion of an analog signal into a series of code bits representing a digitally encoded signal, including the steps of:
- connecting an analog memory means to an external source of analog signals;
- storing an analog signal in the memory means;
- disconnecting the memory means from the external source;
- comparing the signal stored in the memory means to a reference signal by means of a comparator;
- providing an element of the series of code bits having a first logic state if the signal stored in the memory means is not less than the reference signal and having a second logic state if the signal stored in the memory is less than the reference signal;

subtracting the reference signal from the signal stored in the memory means to produce a remainder signal if the stored signal is not less than the reference signal and subtracting zero from the signal stored in the memory means to produce a remainder signal if the stored signal is less than the reference signal;

amplifying the remainder signal by means of an amplifier;

recirculating the amplified remainder signal for storage in the memory means;

repeating the comparing, providing, subtracting, amplifying and recirculating steps; and feeding the signal stored in the memory means at inverse polarity through at least the amplifier back to the memory means in a time period commencing at the end of an interval in which one element of the series of code bits is provided and concluding at the end of an interval in which the next of the series of code bits is provided so that the number of signals outputed from the amplifier at one polarity equals the number of signals outputed from the amplifier at the other polarity.

12. The method of claim 11 wherein the feeding step includes feeding the stored signal at inverse polarity through the comparator and amplifier back to the memory means.

13. A method for nulling errors during conversion of an analog signal into a series of code bits representing a digitally encoded signal, including the steps of:

connecting an analog memory means to an external source of analog signals;

storing an analog signal in the memory means;

disconnecting the memory means from the external source;

comparing the signal stored in the memory means to a reference signal by means of a comparator;

providing an element of the series of code bits having a first logic state if the signal stored in the memory means is not less than the reference signal and having a second logic state if the signal stored in the memory means is less than the reference signal;

subtracting the reference signal from the signal stored in the memory means to produce a remainder signal if the stored signal is not less than the reference signal and subtracting zero from the signal stored in the memory means to produce a remainder signal if the stored signal is less than the reference signal;

amplifying the remainder signal by means of an amplifier;

recirculating the amplified remainder signal for storage in the memory means;

repeating the comparing, providing, subtracting, amplifying and recirculating steps; and feeding the signal stored in the memory means at inverse polarity through at least the memory means back to the memory means in a time period commencing at the end of an interval in which one element of the series of code bits is provided and concluding at the end of an interval in which the next of the series of code bits is provided so that the number of signals outputed from the memory means at one polarity equals the number of signals outputed from the memory means at the other polarity.

14. A method for converting an analog signal into a digitally encoded signal representing at least two digits in a selected number base, including the steps of:

connecting an analog memory means to an external source of analog signals;

storing an analog signal in the memory means;

inverting the polarity of the signal stored in the memory means;

transferring the inverse signal through circuit means back to the memory means for storage;

re-inverting the transferred signal stored in the memory means;

comparing the re-inverted signal with a reference signal supplied by a reference source;

providing a first logic state code bit if the reinverted signal is not less than the reference signal and a second logic state code bit if the re-inverted signal is less than the reference signal;

subtracting the reference signal from the re-inverted signal to produce a remainder signal if the re-inverted signal is not less than the reference signal and subtracting zero from the re-inverted signal to produce a remainder signal if the reinverted signal is less than the reference signal;

selectively amplifying the remainder signal by first and second gain factors, the second gain factor being provided for amplification only after the least significant code bit is determined for each digit;

recirculating the amplified remainder signal for storage in the memory means; and repeating the inverting, transferring, re-inverting, comparing, providing, subtracting, amplifying and recirculating steps until at least two digits are derived;

thereby transferring the signal through the circuit means once at one polarity and then again at opposite polarity while determining a code bit for nulling errors introduced by operation of the circuit means.

15. A method for converting an analog signal into a digitally encoded signal representing at least two digits in a selected number base, including the steps of:

connecting a first analog memory to an external source of analog signals in response to a first control pulse;

storing an analog signal in the first memory;

inverting the polarity of the signal stored in the first memory;

interconnecting the first memory and a second analog memory in response to second control pulses;

receiving the inverse signal into the second memory for storage;

transferring the inverse signal through circuit means back to the first memory for storage in response to fifth and sixth control pulses;

re-inverting the transferred signal stored in the first memory;

accepting the re-inverted signal into the second memory for storage;

supplying a reference signal;

comparing the re-inverted signal with the reference signal in response to seventh control pulses;

providing a first logic state code bit if the reinverted signal is not less than the reference signal and a second logic state code bit if the re-inverted signal is less than the reference signal;

subtracting the reference signal from the re-inverted signal to produce a remainder signal if the re-inverted signal is not less than the reference signal and subtracting zero from the re-inverted signal to produce a remainder signal if the re-inverted signal is less than the reference signal;

selectively amplifying the remainder signal by a first gain factor in response to third control pulses and by a second gain factor in response to fourth control pulses;

recirculating the amplified remainder signal for storage in the first memory; and providing initially the first control pulse and next repetitively providing the second control pulse in a first interval, the fifth and sixth control pulses in a second interval, the second control pulse in a third interval, the seventh control pulse in a fourth interval and the fifth and one of the third and fourth control pulses in a fifth interval until at least two digits are derived, the fourth control pulse being provided only after the least significant code bit is determined for each digit;

thereby transferring the signal through the circuit means once at one polarity and then again at opposite polarity while determining a code bit and amplified remainder signal for nulling errors introduced by operation of the circuit means.

16. The method of claim 14 or 15 wherein a preselected number of digits, L, is encoded, each digit having a predetermined number, N, of code bits; the reference signal is given by the expression $V_R = 2^Y$. Selected Number Base$^z$, where $$2^{y+1} > \frac{|V_{I\,Limit}|}{\text{Selected Number Base}^z} \geq 2^y,$$

Selected Number Base$^{z+1} \geq |V_{I\,Limit}| >$ Selected Number Base$^z$, $V_{I\,Limit}$ is the amplitude of the maximum analog signal to be converted, and y and z are integers; the first gain factor, $G_1$, is two; and the second gain factor is given by the expression $$G_2 = \frac{\text{Selected Number Base}}{2^x},$$

where x is an integer and $2^{x+1} >$ Selected Number Base $\geq 2^x$; thereby providing a binary coded signal in a selected number base.

17. An apparatus for converting an analog signal into a digitally encoded signal representing at least two digits in a selected number base, comprising:

an analog memory means for storing analog signals, said memory means including circuitry for reversing the polarity of an analog signal stored in said memory means;

a first connecting means for connecting said memory means to an external source of analog signals;

a reference source for supplying a reference signal;

a comparator connected to said memory means and said reference source for producing code bits by comparing the inverse of said signal stored in said memory means with said reference signal;

a subtractor connected to said memory means, reference source and comparator for providing a remainder signal by subtracting said reference signal from the inverse of said signal stored in said memory means if the inverse of said signal stored in said memory means is not less than said reference signal and for subtracting zero if the inverse of said signal stored in said memory means is less than said reference signal;

gain factor circuitry, including a third connecting means for providing a first gain factor, a fourth connecting means for providing a second gain factor and a sixth connecting means for providing a unity gain factor;

fifth connecting means for connecting said gain factor circuitry to said memory means; and control means for initially closing said first connecting means and repetitively closing said fifth and sixth connecting means during one interval and then closing said fifth and one of said third and fourth connecting means during another interval until said at least two digits are derived, wherein said fourth connecting means is closed only after the least significant code bit is determined for each said digit prior to deriving the next said digit;

whereby said stored signal is transferred at one polarity and then again at opposite polarity through said converter during determination of said code bit for nulling errors introduced by operation of said converter circuit.

18. The converter apparatus of claim 17 wherein said analog memory means includes:

a first analog memory for storing analog signals;

an inverter having an input and an output, said inverter input being connected to said first analog memory;

a second analog memory for storing analog signals; and a second connecting means for connecting said inverter output to said second memory;

wherein said control means initially closes said first connecting means and next repetitively closes said second connecting means during a first interval, said fifth and sixth connecting means during a second interval, said second connecting means during a following interval and said fifth and one of said third and fourth connecting means during a subsequent interval until said at least two digits are derived, wherein said fourth connecting means is closed only after the least significant code bit is determined for each said digit prior to deriving the next said digit.

19. An apparatus for converting an analog signal into a digitally encoded signal representing at least two digits in a selected number base, comprising:

a control logic and processor means for providing control pulses;

a first analog memory for storing signals, said first memory having an input and an inverse polarity output;

a first connecting means responsive to a first control pulse for connecting said first memory input to an external source of analog signals;

a second analog memory for storing signals, said second memory having an input and an output;

a second connecting means responsive to second control pulses for connecting said inverse polarity output to said second memory input;

a reference source for supplying a reference signal, said reference source having a reference signal output;

a subtractor connected to said second memory output and said reference signal output, said subtractor having a difference signal output, said subtractor being responsive to a first control signal state for producing a remainder signal at said difference output by subtracting said reference signal from said signal stored in said second memory, said subtractor being responsive to a second control state for producing a remainder signal at said difference output by subtracting zero from said signal stored in said second memory;

comparator and gain factor circuitry having first and second inputs and an output, said first input being connected to said difference output, said comparator and gain factor circuitry including:

(a) a sixth connecting means responsive to sixth control pulses for selecting a unity gain factor for amplifying said remainder signal;

(b) a seventh connecting means responsive to seventh control pulses for connecting said reference signal to said second comparator and gain factor circuitry input for producing a first comparator signal when said signal stored in said second memory is not less than said reference signal and a second comparator signal when said signal stored in said second memory is less than said reference signal, one of said first and second comparator signals being produced at said comparator and gain factor circuitry output;

(c) a third connecting means responsive to third control pulses for selecting a first gain factor for amplifying said remainder signal; and (d) a fourth connecting means responsive to fourth control pulses for selecting a second gain factor for amplifying said remainder signal;

a fifth connecting means responsive to fifth control pulses for connecting said comparator and gain factor circuitry output to said first memory input;

said control logic and processor means being connected to said comparator and gain factor circuitry output and initially providing said first control pulse, said control logic and processor means next repetitively providing said second control pulse in a first interval, said fifth and sixth control pulses and said second control signal state in a second interval, said second control pulse in a third interval, said seventh control pulse in a fourth interval and said fifth, and one of said third and fourth control pulses and one of said first and second control signal states in a fifth interval until said at least two digits are derived, wherein said fourth control pulse is provided in said fifth interval only after the least significant code bit is determined for each said digit prior to deriving the next said digit.

20. The converter apparatus of claim 5, 6, 7, 17, 18 or 19 wherein said digitally encoded signal is binary coded decimal in which a binary code encodes digits and said selected number base is base ten, said first gain factor being equal to two and said second gain factor being equal to 1.25.

21. The converter apparatus of claim 5, 6, 7, 17, 18 or 19 wherein said first gain factor is $G_1$, said second gain factor is $G_2$ and N is a predetermined number of code bits determined for each said digit encoded, whereby said digitally encoded signal is in a selected number base $G_1^{(N-1)}G_2$.

* * * * *